US008343695B2

(12) United States Patent
Fujimura et al.

(10) Patent No.: US 8,343,695 B2
(45) Date of Patent: *Jan. 1, 2013

(54) METHOD FOR FRACTURING AND FORMING A PATTERN USING CURVILINEAR CHARACTERS WITH CHARGED PARTICLE BEAM LITHOGRAPHY

(75) Inventors: Akira Fujimura, Saratoga, CA (US); Michael Tucker, Los Altos, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/269,497

(22) Filed: Oct. 7, 2011

(65) Prior Publication Data

US 2012/0025108 A1 Feb. 2, 2012

Related U.S. Application Data

(63) Continuation of application No. 12/618,722, filed on Nov. 14, 2009, now Pat. No. 8,039,176, which is a continuation-in-part of application No. 12/603,580, filed on Oct. 21, 2009, now Pat. No. 7,985,514.

(60) Provisional application No. 61/237,290, filed on Aug. 26, 2009.

(51) Int. Cl.
*G03F 1/20* (2012.01)
*G03F 9/00* (2006.01)

(52) U.S. Cl. ............... 430/5; 430/30; 430/296; 430/396; 430/397; 430/942; 716/53; 716/55

(58) Field of Classification Search ................ 430/5, 30, 430/296, 396, 397, 942; 716/53, 55
See application file for complete search history.

(56) References Cited

U.S. PATENT DOCUMENTS

| 3,768,124 | A | 10/1973 | Maynard |
| 4,438,336 | A | 3/1984 | Riecke |
| 5,082,762 | A | 1/1992 | Takahashi |
| 5,173,582 | A | 12/1992 | Sakamoto et al. |
| 5,334,282 | A | 8/1994 | Nakayama et al. |
| 6,037,601 | A | 3/2000 | Okunuki |
| 6,525,328 | B1 | 2/2003 | Miyoshi et al. |
| 6,768,124 | B2 | 7/2004 | Suzuki et al. |
| 6,815,693 | B2 | 11/2004 | Kamijo et al. |
| 6,891,175 | B2 | 5/2005 | Hiura |
| 7,176,470 | B1 | 2/2007 | Evans et al. |
| 7,378,668 | B2 | 5/2008 | Tanimoto et al. |
| 7,397,053 | B2 | 7/2008 | Mizuno |
| 7,453,063 | B2 | 11/2008 | Ottens Joost et al. |
| 7,550,749 | B2 | 6/2009 | Caliendo et al. |
| 7,707,541 | B2 | 4/2010 | Abrams et al. |
| 7,745,078 | B2 | 6/2010 | Fujimura et al. |
| 7,759,026 | B2 | 7/2010 | Fujimura et al. |
| 7,759,027 | B2 | 7/2010 | Fujimura et al. |
| 7,901,850 | B2 * | 3/2011 | Fujimura et al. ............ 430/5 |
| 7,985,514 | B2 * | 7/2011 | Fujimura et al. ............ 430/5 |
| 8,039,176 | B2 * | 10/2011 | Fujimura et al. ............ 430/5 |
| 2001/0019812 | A1 | 9/2001 | Yamaguchi et al. |
| 2002/0042009 | A1 | 4/2002 | Suzuki |
| 2002/0125444 | A1 | 9/2002 | Kojima |
| 2003/0043358 | A1 | 3/2003 | Suganuma et al. |
| 2003/0059716 | A1 | 3/2003 | Simizu |
| 2003/0077530 | A1 | 4/2003 | Fujiwara et al. |
| 2004/0011964 | A1 | 1/2004 | Sasaki et al. |
| 2005/0091632 | A1 | 4/2005 | Pierrat et al. |
| 2007/0023703 | A1 | 2/2007 | Sunaoshi et al. |
| 2007/0114463 | A1 | 5/2007 | Nakasugi et al. |
| 2007/0263921 | A1 | 11/2007 | Nakasugi et al. |
| 2010/0055580 | A1 | 3/2010 | Fujimura et al. |
| 2010/0227200 | A1 | 9/2010 | Miyata et al. |

FOREIGN PATENT DOCUMENTS

| EP | 1429368 A2 | 6/2004 |
| JP | 03205815 A | 9/1991 |
| JP | 2000091191 A | 3/2000 |
| WO | 03036386 A2 | 5/2003 |

OTHER PUBLICATIONS

U.S. Appl. No. 12/540,328, filed Aug. 12, 2009, titled "Method for Design and Manufacture of a Reticle Using a Two-Dimensional Dosage Map and Charged Particle Beam Lithography", Fujimura et al.
U.S. Appl. No. 61/237,290, filed Aug. 26, 2009, titled "Method and System for Manufacturing a Surface Using Charged Particle Beam Lithography", Hagiwara et al.
U.S. Appl. No. 12/540,321, filed Aug. 12, 2009, titled "Method for Fracturing Circular Patterns and for Manufacturing a Semiconductor Device", Fujimura et al.
U.S. Appl. No. 12/202,366, filed Sep. 1, 2008, titled "Method and System for Design of a Reticle to Be Manufactured Using Character Projection Lithography", Fujimura et al.
Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, Kudan-Kita 1-12-3, Chiyoda-ku, Tokyo 102-0073, Japan.
Hattori, K. et al., "Electron Beam Direct Writing System EX-8D Employing Character Projection Exposure Method", Journal of Vacuum Science Technology, vol. B11(6) (1993), pp. 2346-2351, 1993, American Vacuum Society, 125 Maiden Lane, 15th Floor, New York, NY 10038.
Yamada, A. et al., "Variable cell projection as an advance in electron-beam cell projection system", Journal of Vacuum Science Technology, B 22(6) (2004), pp. 2917-2922, American Vacuum Society, 125 Maiden Lane, 15th Floor, New York, NY 10038.
Extended European Search report dated Apr. 28, 2011 for EPO Application No. 10173794.8.

(Continued)

*Primary Examiner* — Christopher Young
(74) *Attorney, Agent, or Firm* — The Mueller Law Office, PC

(57) ABSTRACT

In the field of semiconductor production using shaped charged particle beam lithography, a method and system for fracturing or mask data preparation or proximity effect correction is disclosed, wherein a series of curvilinear character projection shots are determined for a charged particle beam writer system, such that the set of shots can form a continuous track, possibly of varying width, on a surface. In some embodiments, characteristics of the continuous track will be within a predetermined tolerance.

25 Claims, 8 Drawing Sheets

OTHER PUBLICATIONS

International Search Report and Written Opinion for International Application No. PCT/US2010/051393 dated May 30, 2011.

Nishimura, S. et al. "Development of a mask-scan electron beam mask writer", Journal of Vacuum Science & Technology B (Microelectronics and Nanometer Structures). vol. 20, No. 6, Nov. 1, 2002, pp. 2640-2645 XP002632946.

Notice of Allowance mailed on Mar. 22, 2011 for U.S. Appl. No. 12/603,580.

Office Action dated Oct. 26, 2011 for U.S. Appl. No. 12/898,646.

Office Action dated Jul. 8, 2011 for U.S. Appl. No. 12/898,646.

Notice of Allowance and Fees Due dated Jun. 1, 2012 for U.S. Appl. No. 13/274,346.

Office Action dated Mar. 30, 2012 for U.S. Appl. No. 12/898,646.

Office Action dated Aug. 22, 2012 for U.S. Appl. No. 12/862,741.

* cited by examiner

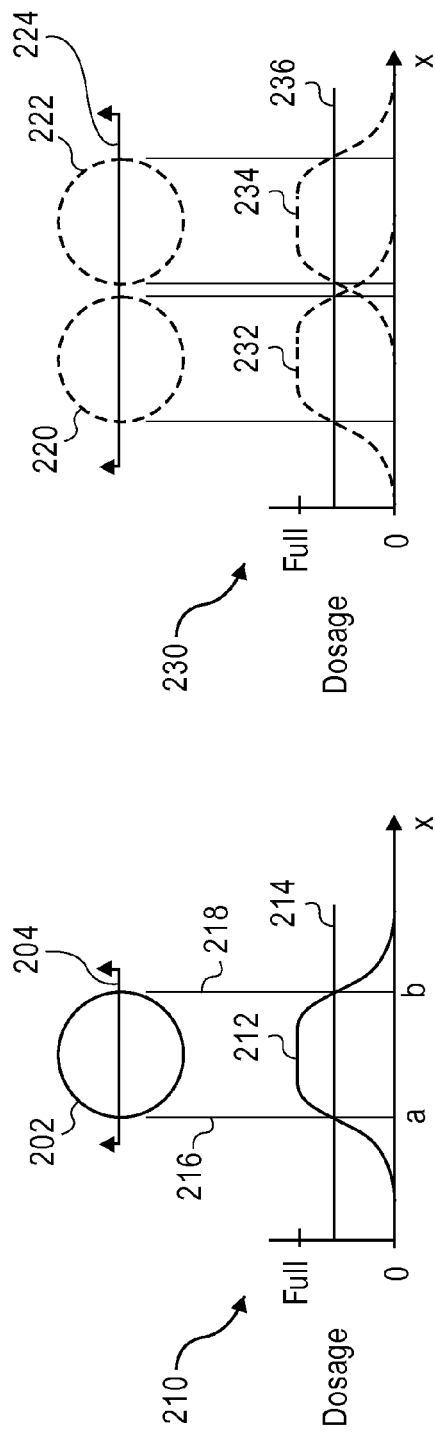
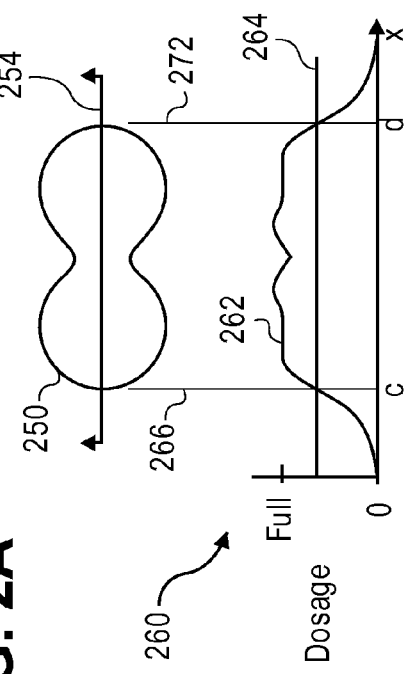
FIG. 2A
FIG. 2B
FIG. 2C

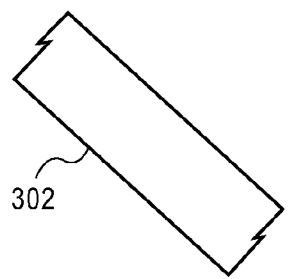
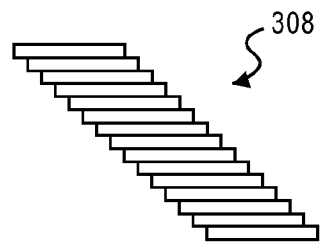
FIG. 3A            FIG. 3B
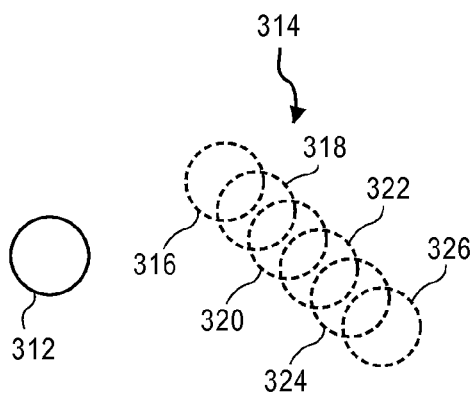
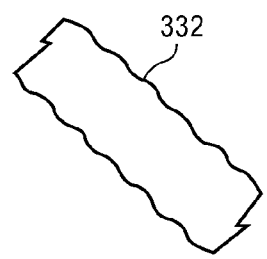
FIG. 3C            FIG. 3D
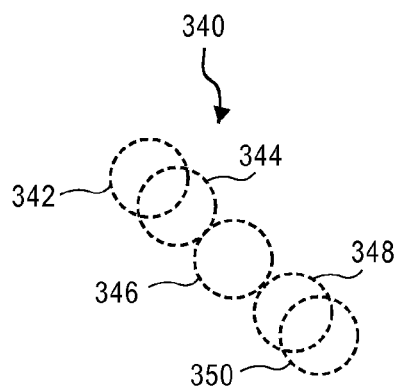
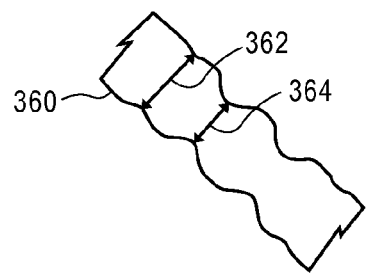
FIG. 3E            FIG. 3F

METHOD FOR FRACTURING AND FORMING A PATTERN USING CURVILINEAR CHARACTERS WITH CHARGED PARTICLE BEAM LITHOGRAPHY

RELATED APPLICATIONS

This application is a continuation of U.S. patent application Ser. No. 12/618,722 entitled "Method For Fracturing and Forming a Pattern Using Curvilinear Characters With Charged Particle Beam Lithography", filed on Nov. 14, 2009, which 1) is a continuation-in-part of U.S. patent application Ser. No. 12/603,580 entitled "Method For Fracturing A Pattern For Writing With A Shaped Charged Particle Beam Writing System Using Dragged Shots", filed on Oct. 21, 2009; and 2) claims priority from U.S. Provisional Patent Application Ser. No. 61/237,290 filed Aug. 26, 2009, entitled "Method and System For Manufacturing a Surface Using Charged Particle Beam Lithography"; all of which are hereby incorporated by reference for all purposes.

BACKGROUND OF THE DISCLOSURE

The present disclosure is related to lithography, and more particularly to the design of a charged particle beam writer system and methods for using the charged particle beam writer system to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. In CP charged particle beam lithography, there is a stencil in the system that has in it a variety of apertures or characters which may be rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce on the substrate the original circuit design by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs is less than that for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

There are a number of technologies used for forming patterns on a reticle, including using optical lithography or charged particle beam systems. Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam system, allowing the creation of more accurate photomasks. The total writing time for this type of system increases with the number of shots. A second type of system that can be used for forming patterns on a reticle is a character projection system, which has been described above.

The cost of charged particle beam lithography is directly related to the time required to expose a pattern on a surface, such as a reticle or wafer. Conventionally, the exposure time is related to the number of shots required to produce the pattern. For the most complex integrated circuit designs, forming the set of layer patterns, either on a set of reticles or on a substrate, is a costly and time-consuming process. It would therefore be advantageous to be able to reduce the time required to form complex patterns, such as curvilinear patterns, on a reticle and other surfaces, such as by reducing the number of shots required to form these complex patterns.

SUMMARY OF THE DISCLOSURE

A method and system for fracturing or mask data preparation or proximity effect correction is disclosed, wherein a series of curvilinear character projection shots are determined for a charged particle beam writer system, such that the set of shots can form a continuous track, possibly of varying width, on a surface. In some embodiments, characteristics of the continuous track will be within a predetermined tolerance.

BRIEF DESCRIPTION OF THE DRAWINGS

FIG. 2A illustrates a pattern and a cross-sectional dosage curve produced by a single circular CP shot;

FIG. 2B illustrates two proximate, individually-calculated patterns and dosages curves similar to the pattern and dosage curve of FIG. 2A;

FIG. 2C illustrates a pattern and a cross-sectional dosage graph of a pair of proximate circular CP shots;

FIG. 3A illustrates a portion of a constant-width target pattern;

FIG. 3B illustrates a set of conventional non-overlapping shots which can form the pattern of FIG. 3A;

FIG. 3C illustrates a pattern which can be formed by a single circular CP shot, and also a set of six proximate CP shots;

FIG. 3D illustrates a track which can be formed using the set of proximate CP shots from FIG. 3C;

FIG. 3E illustrates a set of five proximate CP shots;

FIG. 3F illustrates a track which can be formed using the set of five proximate CP shots from FIG. 3E;

DETAILED DESCRIPTION OF THE EMBODIMENTS

The present disclosure describes generating and exposing a series of curvilinear CP shots to form a continuous track on a surface. A series of shots form a spatial succession, and may be written in any temporal order. Note that the numbers of shots used in the various embodiments illustrated herein are exemplary only, as a series of shots of the present disclosure may number from two or more as desired to achieve the desired target pattern.

Figure 1:
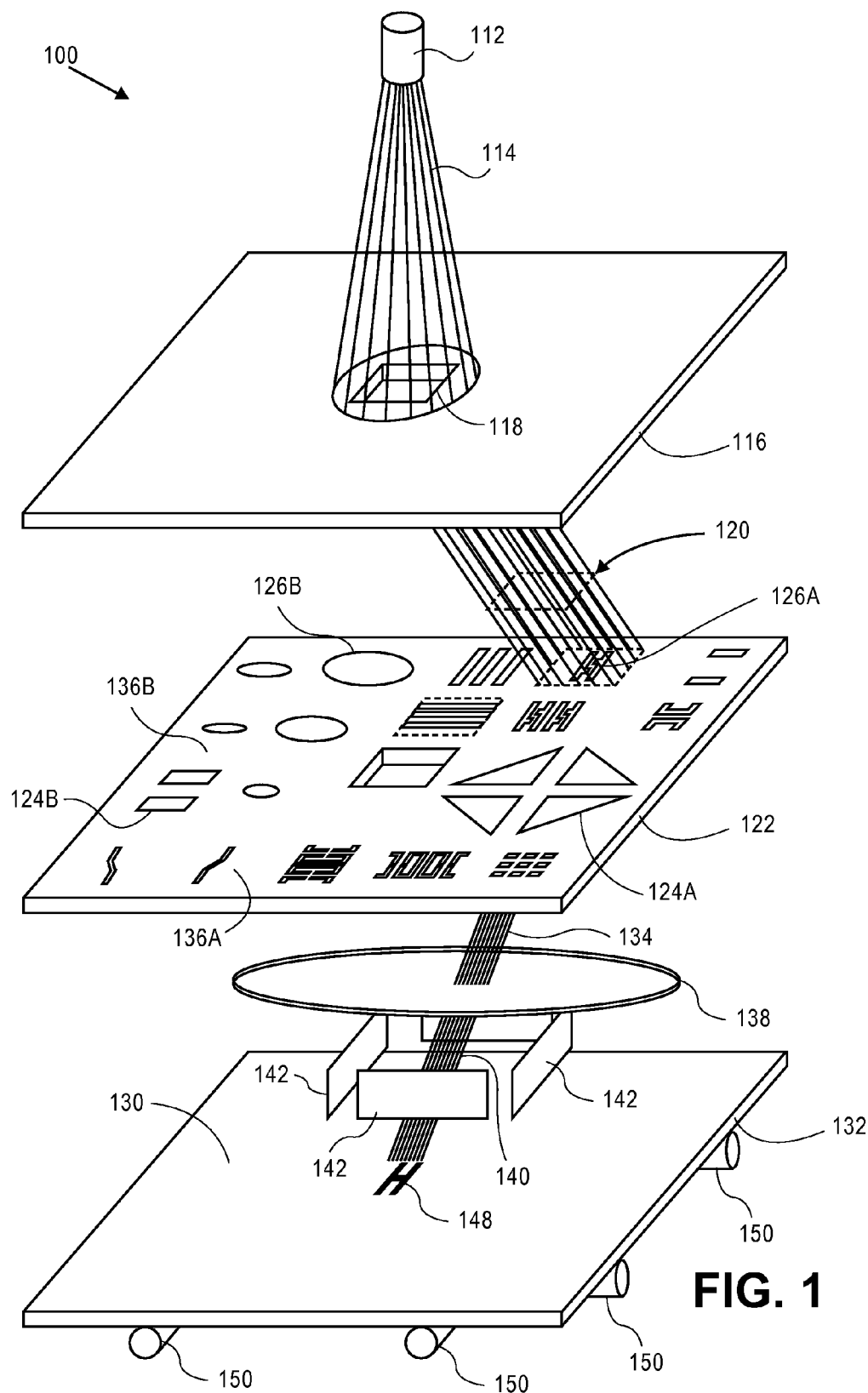
FIG. 1 illustrates a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142.

Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

FIG. 2A illustrates an example of a pattern 202 which would be formed on a resist-coated surface by a shot using a circular CP character. Pattern 202 is called a shot outline, which is the pattern that can be formed by the dosage from a single shot. Throughout this disclosure, a pattern which is a shot outline may be referred to as a shot, meaning the shot which can form the shot outline. Dosage graph 210 illustrates the dosage 212 registered along a line 204 through pattern 202, this dosage being called the cross-sectional dosage. As can be seen from dosage curve 212, a pre-determined "full" dosage is registered only in the middle part of pattern 202. Also shown in dosage graph 210 is the resist threshold 214. The resist will register as a pattern on the surface only those areas which receive dosages above the resist threshold 214. The dosage curve 212 intersects the threshold 214 at X-coordinates "a" and "b". The X-coordinate "a" is therefore the minimum X-coordinate that will be registered by the resist along line 204, as shown by connector 216. Similarly, the X-coordinate "b" is the maximum X-coordinate that will be registered by the resist along line 204, as shown by connector 218.

FIG. 2B illustrates an example of two shots in close proximity. Dashed line pattern 220 is the shot outline of a circular CP character shot. Dashed line pattern 222 is the shot outline of another circular CP character shot. The dosage graph 230 illustrates two dosage curves. Dosage curve 232 shows the cross-sectional dosage of shot outline 220, as measured along a line 224. Dosage curve 234 shows the cross-sectional dosage of shot outline 222, as measured along the line 224. Also shown on dosage graph 230 is the resist threshold 236. As can be seen from dosage graph 230, the dosage curve 232 and dosage curve 234 overlap, indicating that for some X-coordinates along line 224, the shots associated with both shot outline 220 and shot outline 222 will contribute a measurable dosage. In cases where shot dosage curves overlap, the total dosage reaching the resist-covered surface is the combination, such as by addition, of the dosages from all shots corresponding to the overlapping curves. FIG. 2C illustrates a dosage graph 260 which shows the combined dosage curve 262 for shot outline 220 and shot outline 222 of FIG. 2B. As can be seen, the combined dosage curve 262, which shows the dosage along line 224, shows a dosage that is above the threshold 264 at all X-coordinates between "c" and "d". Pattern 250 shows the pattern that will be formed on the resist-covered surface by the two proximate shots which are associated with shot outline 220 and shot outline 222. The cross sectional dosage for this pattern is measured along line 254, which corresponds to line 224 of FIG. 2B. Along line 254, the two proximate shots form a single connected pattern 250. The left-most intersection of dosage curve 262 with threshold 264 at X-coordinate "c" determines the minimum X-coordinate of pattern 250 along line 254, as shown by connector 266. Similarly, the right-most intersection of dosage curve 262 with threshold 264 at X-coordinate "d" determines the maximum X-coordinate of pattern 250, as shown by connector 272. As can be seen, pattern 250 has a non-constant height in the Y-dimension, due to the use of a circular CP character for shot 220 and shot 222. FIGS. 2B&C illustrate how a plurality of proximate CP shots of a curvilinear CP character may together produce a single pattern on a resist-covered surface.

FIG. 3A illustrates an example of a portion of a desired pattern 302 to be formed on a resist-coated surface. Pattern 302 is a portion of a longer pattern, so the ends of the pattern are not shown. The edges of pattern 302 are not parallel to either axis of a Cartesian coordinate plane. Pattern 302 may, for example, be part of a metal interconnect layer on an integrated circuit. Pattern 302 is also a track or continuous track, where a track is a pattern that can be visualized geometrically as being formed with a single stroke of a paintbrush—i.e. a pattern with no branches. Unlike a normal paintbrush stroke, however, the width of a track may vary along its length. FIG. 3B illustrates the shot outlines 308 of a group of non-overlapping rectangular VSB shots, such as may be conventionally determined for forming pattern 302. Shot group 308 shows the shot outlines of 15 shots. The use of conventional non-overlapping shots may simplify determination of the pattern that the resist will register from the group of shots. Conventionally, a set of non-overlapping shots is determined such that the union of each of the shot outlines will equal the target pattern. The union of the shot outlines in the group of shots 308 does not quite equal the desired pattern 302 because the outline of pattern 302 cannot be matched exactly using rectangular shots which are oriented parallel to the axes of a Cartesian coordinate plane.

FIGS. 3C-3F depict an exemplary method of the present disclosure wherein the target pattern 302 is formed using a series of curvilinear shots. FIG. 3C illustrates an example of a shot outline 312 using a circular CP character. FIG. 3C also illustrates the shot outlines 314 of a group of shots which use the same character as pattern 312. The group of shots 314 comprises six shots: shot 316, shot 318, shot 320, shot 322, shot 324 and shot 326. In this example all the shots in shot group 314 use the same dosage, but shots using different dosages may also be used to form a track. The group of shots 314 forms a series, because the shots are in succession spatially, although the shots may be written on the surface in any temporal order. FIG. 3D illustrates a shape, the shape also being a track, that may be formed on a surface from the shots associated with shot series 314. The overlapping shot outlines in shot series 314 make the calculation of the resist response, and therefore the resulting pattern on the surface, more difficult than with shot group 308. Charged particle beam simulation may be used to determine the pattern 332 registered by the resist. In one embodiment, charged particle beam simulation may be used to calculate the dosage for each grid location in a two-dimensional (X and Y) grid, creating a grid of calculated dosages called a dosage map. The "wavy" edges in the registered pattern 332 result from using the spaced circular CP characters. The "waviness" of the edges causes variation in the width of the pattern 332. The width tolerance for a group of patterns is normally pre-determined. The width variation in pattern 332 can be reduced by spacing the circular CP shots more closely, which will increase the number of shots required to form the pattern. Since wider spacing of the circular CP shots can reduce the shot count and therefore the time to write the pattern, the pre-determined width tolerance can be used to determine the maximum acceptable spacing of the circular CP shots. An advantage of using circular CP shots for forming target patterns such as the target pattern 302 is that a circle is radially symmetrical. The effects of using a circular CP character are therefore similar irrespective of the angle of the target pattern. The pattern 332 illustrates how a series of curvilinear CP shots may be used to form a track on a surface, where the track is not parallel to an axis of a Cartesian coordinate plane.

FIG. 3E illustrates another example of how a series of shots, in this case with some overlapping shots, may be used to form a pattern similar to the target pattern 302, using a circular CP character. FIG. 3E illustrates the shot outlines of a group of shots 340 which use the same character as pattern 312. Shot group 340 comprises five shots: shot 342, shot 344, shot 346, shot 348 and shot 350. As can be seen, the relative spacing of the shots in shot group 340 varies among the shots in the group. For example, the spacing between shot 342 and shot 344 is less than the spacing between shot 344 and shot 346. Similarly, the spacing between shot 350 and shot 348 is less than the spacing between shot 346 and shot 348. FIG. 3F illustrates a pattern 360 that may be formed on a resist-covered surface from shot group 340. The waviness of pattern 360 varies along its length because of the variable spacing of the shots in shot group 340. For example, the localized minimum width 362 in pattern 360 is due to the spacing between shot 342 and shot 344. The localized minimum width 364 in pattern 360 is due to the spacing between shot 344 and shot 346. The relatively larger spacing between shot 344 and shot 346 compared to the spacing between shot 342 and shot 344 results in a smaller width 364 compared to width 362. While use of a pre-determined width tolerance will normally suggest that the waviness of a single track be consistent to optimize the shot count, the example of FIG. 3E and FIG. 3F illustrates how a larger shot spacing, with no dosage or beam blur radius changes, can produce increased waviness in the resulting pattern on the surface. The pre-determined width tolerance for the final pattern on the surface may therefore be used to determine the maximum acceptable spacing of shots.

Referring again to FIG. 3C, it should be noted that although all shots in shot series 314 are made using the same character, tracks may be formed using a series of shots using a plurality of characters. In one embodiment, different sizes of circular CP characters may be used for different subsets of shots in a series of shots, producing a track of varying mean width. In another embodiment, a single CP character may be used for all shots in a series, but with different dosages for different subsets of shots in the series, also producing a track of varying mean width.

Figure 4A:
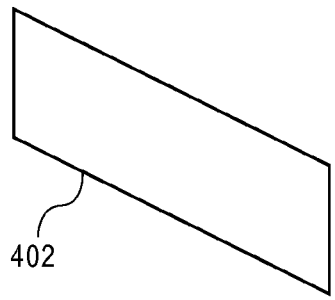
FIG. 4A illustrates an example of a target pattern comprising a parallelogram.
Figure 4B:
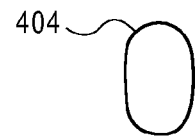
FIG. 4B illustrates a pattern that can be formed with a shot of an oval CP character.
Figure 4C:
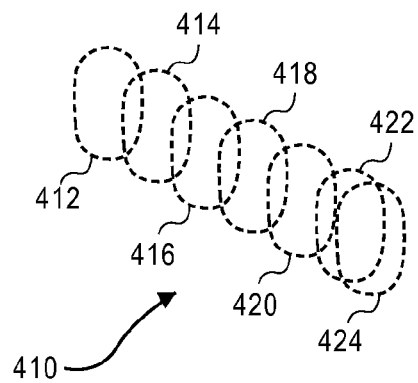
FIG. 4C illustrates a series of seven shots of the same oval CP character as FIG. 4B.
Figure 4D:
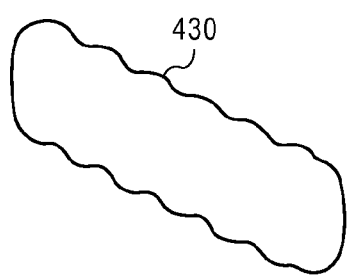
FIG. 4D illustrates a track which can be formed by the set of shots in FIG. 4C.

FIGS. 4A-4E depict another embodiment of the present invention in which an oval character is used. FIG. 4A illustrates an example of a desired pattern or track 402 to be formed on a resist-coated surface. The edges of track 402 are not parallel to either axis of a Cartesian coordinate plane. Track 402 may, for example, be part of a metal interconnect layer on an integrated circuit. FIG. 4B illustrates a shot outline 404 of an oval CP character. FIG. 4C illustrates the shot outlines of a series of CP shots 410 using the same oval character associated with shot outline 404. Shot series 410 consists of seven overlapping shots: shot 412, shot 414, shot 416, shot 418, shot 420, shot 422 and shot 424. As can be seen, the spacing between shot 422 and shot 424 is less than the spacing between other pairs of adjacent shots in shot series 410, so as to match the length of the track 402. FIG. 4D illustrates a track 430 that may be formed on a resist-coated surface from the shot series 410, using a normal—i.e. minimum—beam blur radius. Like track 332 above, the width of track 430 varies along its length. An advantage of using an oval CP character to form the shot series 410, compared to the circular CP character used to form the shot series 314, is that use of an oval shape results in a smaller area of overlap between adjacent shots compared to use of a circular shape. The smaller area of overlap between shots in shot series 410 lowers the dosage per unit area compared to shot series 314. This may be advantageous by producing a lower level of long range effects such as back scattering when the surface is exposed, compared to the shot series 314.

Figure 4E:
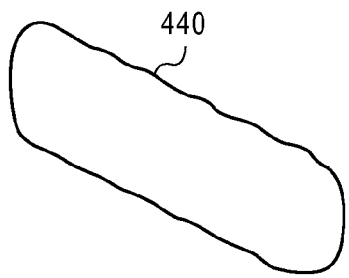
FIG. 4E illustrates another track which can be formed by the set of shots in FIG. 4C, using a higher-than-minimum beam blur radius.

FIG. 4E illustrates a track 440 that may be registered by the resist-coated surface from the shot series 410, when a higher-than-minimum beam blur is used. As can be seen, track 440 is smoother than track 430. Specifically, the difference between the maximum width and the minimum width of track 440 is less than the difference between the maximum width and the minimum width of track 430. The use of higher-than-minimum beam blur may allow the formation of tracks to a tighter—i.e. smaller—width tolerance than by using the minimum-available beam blur.

Figure 5A:
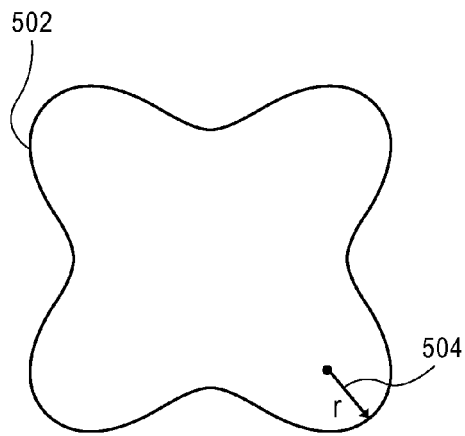
FIG. 5A illustrates an example of a curvilinear target pattern.
Figure 5B:
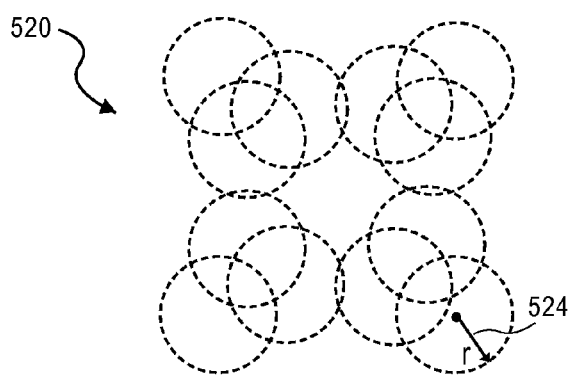
FIG. 5B illustrates a series of circular CP shots which can form the perimeter of the pattern of FIG. 5A.
Figure 5C:
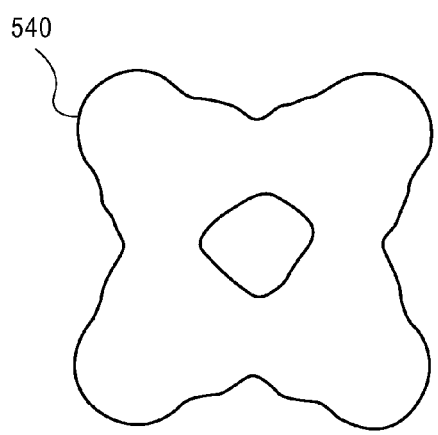
FIG. 5C illustrates the pattern formed by the set of perimeter shots in FIG. 5B.

A series of curvilinear shots may also be used to form the perimeter of a pattern, as demonstrated in FIGS. 5A-5C. FIG. 5A illustrates an example of a curvilinear pattern 502 to be formed on a resist-coated surface. The pattern 502 may, for example, be the output of inverse lithography processing. The pattern 502 may be described as having four ears—one at each corner. Each ear has a radius of curvature 504, also marked "r". FIG. 5B illustrates the shot outlines of a series 520 of twelve circular shots that may be used to form the perimeter of pattern 502. The radius 524 of the outline of individual shots in the series of shots 520 is chosen to be "r", so as to form each of the ears of pattern 502 with a minimal shot count. FIG. 5C illustrates a track 540 that may be produced the series of shots 520. Track 540 is a closed track, with no start or end. The use of circular CP shots allows formation of the perimeter of track 540, which matches the perimeter of pattern 502 within a pre-determined tolerance, using fewer shots than if a set of rectangular VSB shots had been used. Additionally, the use of a circular CP character and dosage which can produce a pattern on the surface with a radius which closely matches the interior radius of a part of the target pattern can further reduce the shot count. The series 520 may be combined with additional shots to fill the interior of the pattern 540 to achieve the target pattern 502.

Figure 6B:
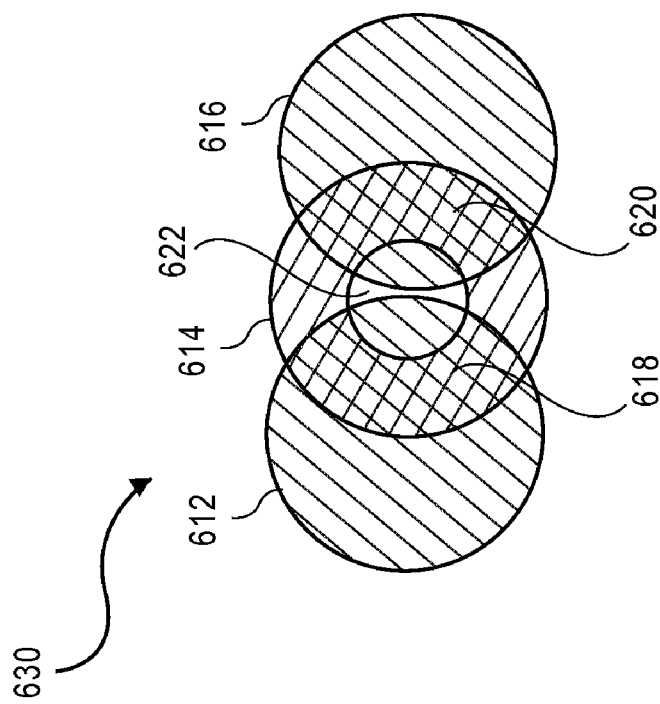
FIG. 6B illustrates a series of three CP shots, wherein two of the shots use a circular CP character and one of the shots uses an annular CP character.
Figure 6A:
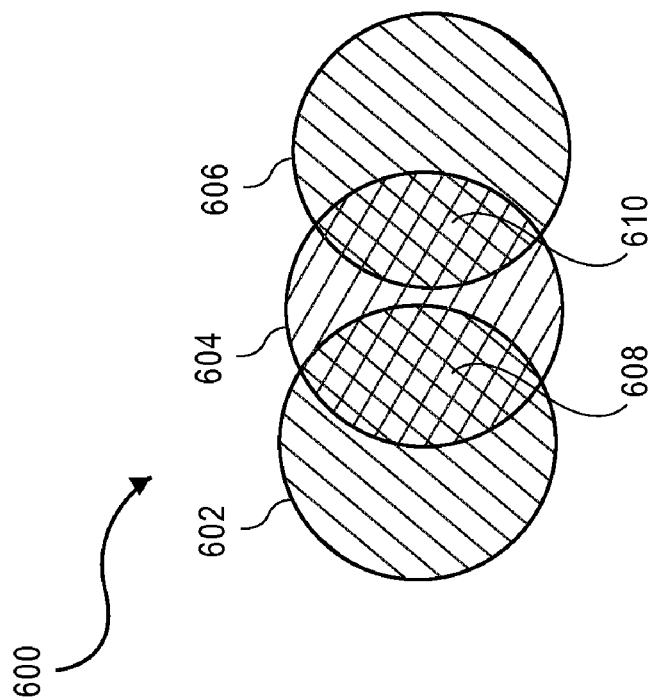
FIG. 6A illustrates a series of three circular CP shots which can form a track.

FIGS. 6A&B illustrate a comparison of the use of a circular CP character with use of an annular CP character in forming a track. FIG. 6A illustrates the shot outlines for an exemplary series of three shots 600, the combination of which will form a track. Shot series 600 comprises shot 602, shot 604 and shot 606, all of which are made using a circular CP character. The outline of the resulting track is not shown. Region 608 and region 610 are areas which will receive a dosage above a normal dosage, due to shot overlap. FIG. 6B illustrates the shot outlines for another exemplary series of three shots 630 which will also form a track. Shot series 630 comprises circular shot 612, annular shot 614, and circular shot 616. Region 618 and region 620 are the intersecting areas which will receive a dosage above a normal dosage, due to shot overlap. As can be seen, the area of region 618 is less than the area of region 608. Similarly, the area of region 620 is less than the area of region 610. This smaller area of region 618 compared to region 608 and region 620 compared to region 610 indicates that less overlap dosage will be delivered to the resist-coated surface in shot series 630 than in shot series 600. The lower dosage of the shot series 630 may be preferred so as to produce, for example, a lower level of backward scattering than the shot series 600. As is also shown in FIG. 6B, region 622, which is part of the "hole" in the outline of annular shot 614, may not register on the resist as a pattern, producing a void in the resulting track. Since the actual dosage received by any part of region 622 is the combination of dosages from shot 612, shot 614 and shot 616, particle beam simulation may be used to determine if the dosage in all parts of region 622 is above the threshold of the resist. If particle beam simulation results show that the dosage in some part of region 622 is below the resist threshold, an annular CP character with a smaller hole may be substituted for the annular shot, so that the pattern 622 has a smaller hole. Alternatively, the dosage of any combination of shots in the pattern may be slightly increased, such as increasing the dosage for circular shots 612 and 616. In yet other embodiments, for tracks which are straight tracks, an annular CP character with an elliptical or oval hole may be used, wherein the major or longer diameter of the hole is aligned with the direction of the track. Other more complex shapes may also be used for shot 614. The example of FIGS. 6A&B show how the use of annular CP shots may allow formation of tracks with overall lower dosage than circular or other non-annular curvilinear shots. Careful design can prevent voids in the formed patterns.

Note that curvilinear shapes referred to in this disclosure include but are not limited to circular, nearly circular, oval, nearly oval, elliptical, nearly elliptical, annular, nearly annular, oval-annular, nearly oval-annular, elliptically annular, or nearly elliptically annular.

The dosage that would be received by a surface can be calculated and stored as a two-dimensional (X and Y) dosage map called a glyph. A two-dimensional dosage map or glyph is a two-dimensional grid of calculated dosage values for the vicinity of the shots comprising the glyph. This dosage map or glyph can be stored in a library of glyphs. The glyph library can be used as input during fracturing of the patterns in a design. For example, referring again to FIGS. 4A&C, a dosage map may be calculated from the series of shots 410, and stored in the glyph library. If during fracturing, one of the input patterns is a pattern of the same shape as pattern 402, then the shots comprising the glyph may be retrieved from the library, avoiding the computational effort of determining an appropriate set of shots to form input pattern. A series of glyphs may also be combined to create a parameterized glyph. Parameters may be discrete or may be continuous. For example, the shots and dosage maps for forming patterns such as track 402 may be calculated for a plurality of pattern lengths, and the plurality of resulting glyphs may be combined to form a parameterized glyph.

Figure 7:
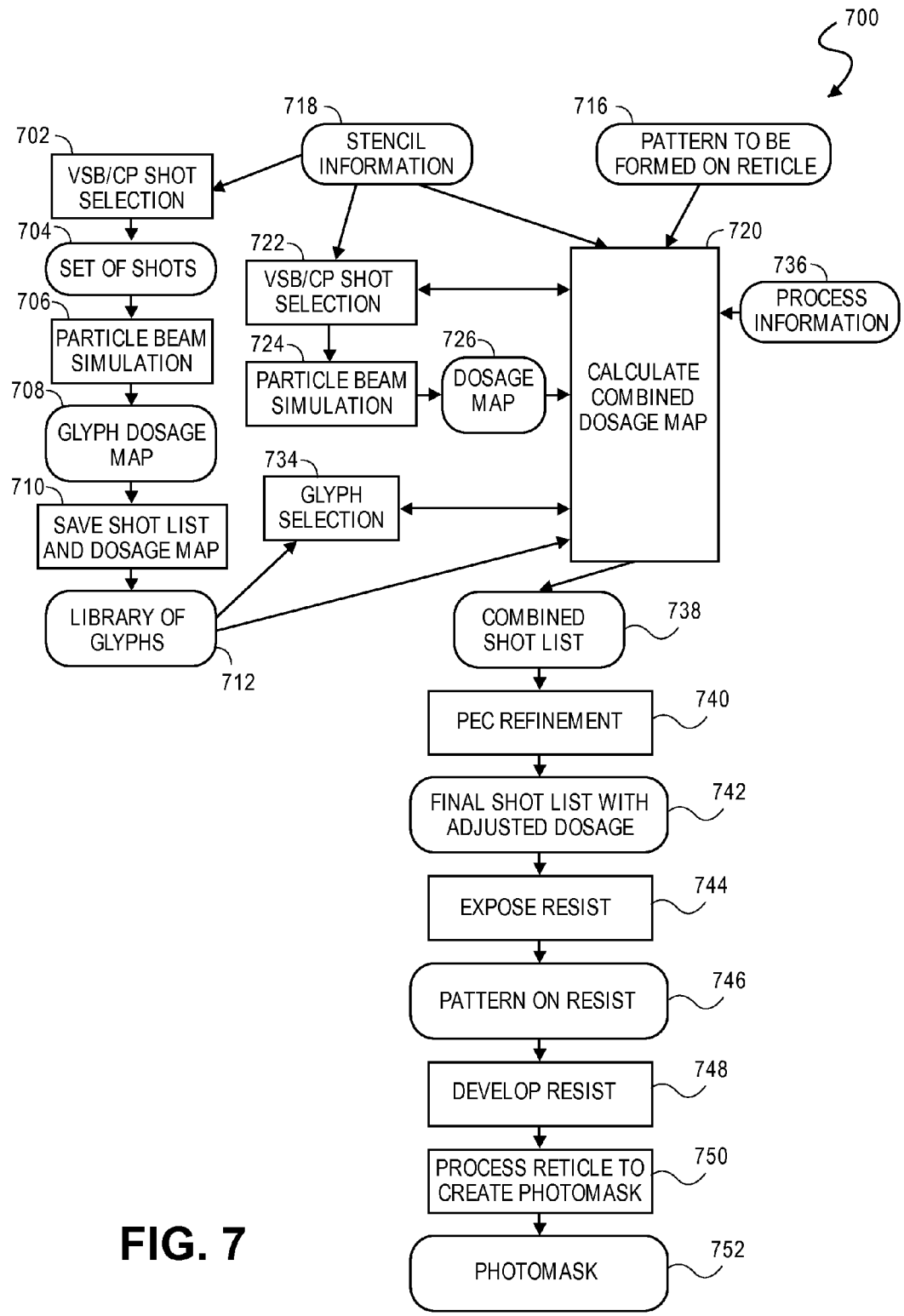
FIG. 7 illustrates a conceptual flow diagram for manufacturing a reticle and photomask using an exemplary method of the current disclosure.

FIG. 7 illustrates an exemplary conceptual flow diagram 700 of a method for manufacturing a photomask according to the current disclosure. There are three types of input data to the process: stencil information 718, which is information about the CP characters on the stencil of the charged particle beam system; process information 736, which includes information such as the resist dosage threshold above which the resist will register a pattern; and a computer representation of the desired pattern 716 to be formed on the reticle. In addition, initial optional steps 702-712 involve the creation of a library of glyphs. The first step in the optional creation of a library of glyphs is VSB/CP shot selection 702, in which one or more VSB or CP shots, each shot with a specific dosage, are combined to create a set of shots 704. The set of shots 704 may include overlapping VSB shots and/or overlapping CP shots. The set of shots 704 may include a series of curvilinear CP shots which will form a track. Shots in the set of shots may also have a beam blur specified. The VSB/CP shot selection step 702 uses the stencil information 718, which includes information about the CP characters that are available on the stencil. The set of shots 704 is simulated in step 706 using charged particle beam simulation to create a dosage map 708 of the set of shots. Step 706 may include simulation of various physical phenomena including forward scattering, resist diffusion, Coulomb effect, etching, fogging, loading, resist charging, and backward scattering. The result of step 706 is a two-dimensional dosage map 708 which represents the combined dosage from the set of shots 704 at each of the grid positions in the map. The dosage map 708 is called a glyph. In step 710 the information about each of the shots in the set of shots, and the dosage map 708 of this additional glyph is stored a library of glyphs 712. In one embodiment, a set of glyphs may be combined into a type of glyph called a parameterized glyph.

The required portion of the flow 700 involves creation of a photomask. In step 720 a combined dosage map for the reticle or reticle portion is calculated. Step 720 uses as input the desired pattern 716 to be formed on the reticle, the process information 736, the stencil information 718, and the glyph library 712 if a glyph library has been created. In step 720 an initial reticle dosage map may be created, into which the shot dosage maps will be combined. Initially, the reticle dosage map contains no shot dosage map information. In one embodiment, the grid squares of the reticle dosage map may be initialized with an estimated correction for long-range effects such as backscattering, fogging, or loading, a term which refers to the effects of localized resist developer depletion. Step 720 may involve VSB/CP shot selection 722, or glyph selection 734, or both of these. Shot selection 722 may comprise selecting a series of curvilinear CP shots which can form a track on the reticle. If a VSB or CP shot is selected, the shot is simulated using charged particle beam simulation in step 724 and a dosage map 726 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. Both VSB and CP shots may be allowed to overlap, and may have varying dosages with respect to each other. If a glyph is selected, the dosage map of the glyph is input from the glyph library. In step 720, the various dosage maps of the shots and/or glyphs are combined into the reticle dosage map. In one embodiment, the combination is done by adding the dosages. Using the resulting combined dosage map and the process information 736 containing resist characteristics, a reticle pattern may be calculated. If the calculated reticle pattern matches the desired pattern 716 within a pre-determined tolerance, then a combined shot list 738 is output, containing the determined VSB/CP shots and the shots constituting the selected glyphs. If the calculated reticle pattern does not match the target pattern 716 within a predetermined tolerance as calculated in step 720, the set of selected CP shots, VSB shots and/or glyphs is revised, the dosage maps are recalculated, and the reticle pattern is recalculated. In one embodiment, the initial set of shots and/or glyphs may be determined in a correct-by-construction method, so that no shot or glyph modifications are required. In another embodiment, step 720 includes an optimization technique so as to minimize either the total number of shots represented by the selected VSB/CP shots and glyphs, or the total charged particle beam writing time, or some other parameter. In yet another embodiment, VSB/CP shot selection 722 and glyph selection 734 are performed so as to generate multiple sets of shots, each of which can form a reticle image that matches the desired pattern 716, but at a lower-than-normal dosage, to support multi-pass writing.

The combined shot list 738 comprises the determined list of selected VSB shots, selected CP shots and shots constituting the selected glyphs. All the shots in the final shot list 738 include dosage information. Shots may also include a beam blur specification. In step 740, proximity effect correction (PEC) and/or other corrections may be performed or corrections may be refined from earlier estimates. Thus, step 740 uses the combined shot list 738 as input and produces a final shot list 742 in which the shot dosages have been adjusted. The group of steps from step 720 through step 742, or subsets of this group of steps, are collectively called fracturing or mask data preparation. The final shot list 742 is used by the charged particle beam system in step 744 to expose resist with which the reticle has been coated, thereby forming a pattern 746 on the resist. In step 748 the resist is developed. Through further processing steps 750 the reticle is transformed into a photomask 752.

Figure 8:
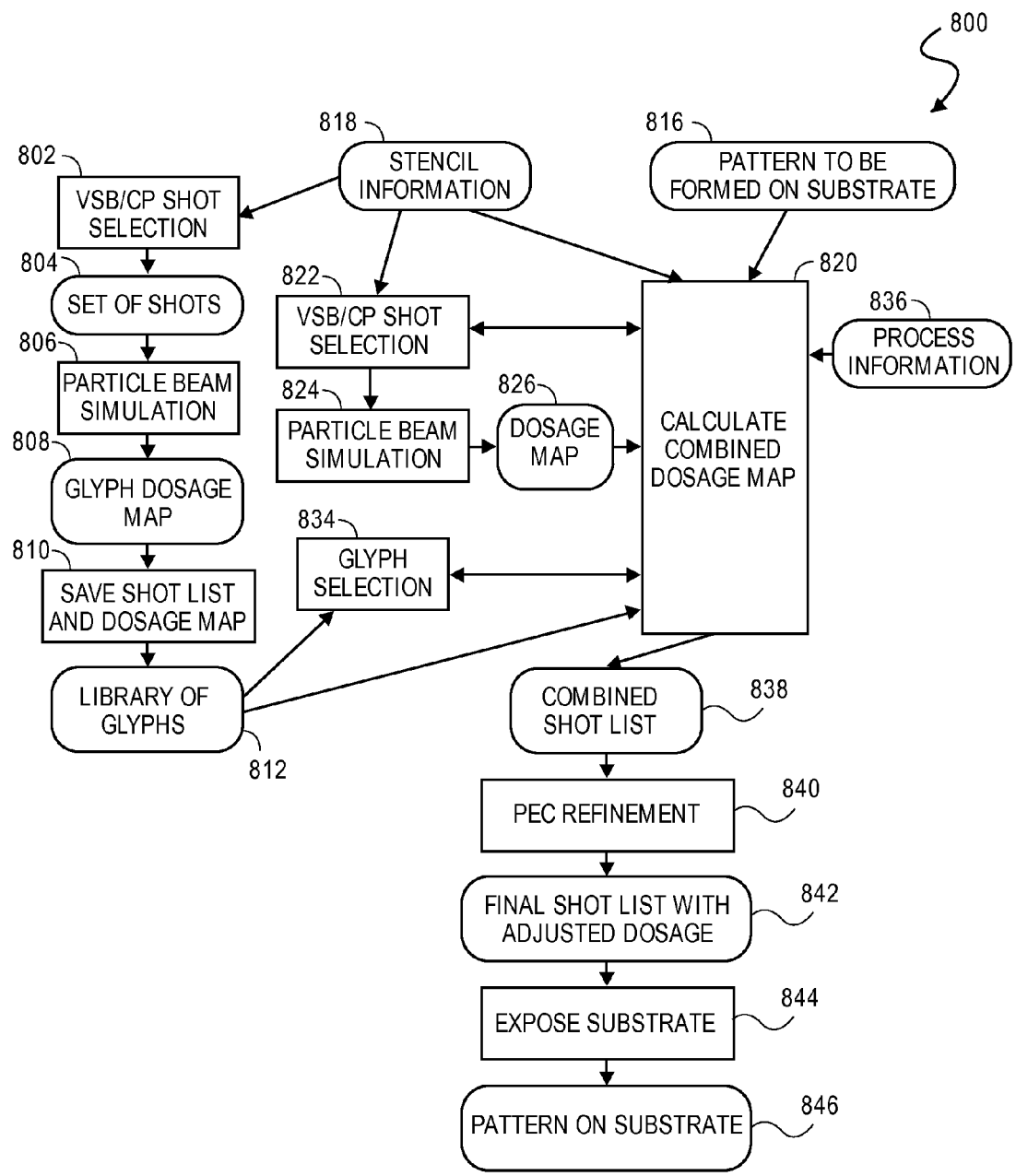
FIG. 8 illustrates a conceptual flow diagram for forming a pattern on a substrate using an exemplary method of the current disclosure.

FIG. 8 illustrates an exemplary conceptual flow diagram 800 of a method for manufacturing a substrate such as a silicon wafer according to the current disclosure. There are three types of input data to the process: stencil information 818, which is information about the CP characters on the stencil of the charged particle beam system; process information 836, which includes information such as the resist dosage threshold above which the resist will register a pattern; and a computer representation of the desired pattern 816 to be formed on the substrate. In addition, initial optional steps 802-812 involve the creation of a library of glyphs. The first step in the optional creation of a library of glyphs is VSB/CP shot selection 802, in which one or more VSB or CP shots, each shot with a specific dosage, are combined to create a set of shots 804. The set of shots 804 may include overlapping VSB shots and/or overlapping CP shots. The set of shots 804 may include a series of curvilinear CP shots which will form a track. Shots in the set of shots may also have a beam blur specified. The VSB/CP shot selection step 802 uses the stencil information 818, which includes information about the CP characters that are available on the stencil. The set of shots 804 is simulated in step 806 using charged particle beam simulation to create a dosage map 808 of the set of shots. Step 806 may include simulation of various physical phenomena including forward scattering, resist diffusion, Coulomb effect, etching, fogging, loading, resist charging, and backward scattering. The result of step 806 is a two-dimensional dosage map 808 which represents the combined dosage from the set of shots 804 at each of the grid positions in the map. The dosage map 808 is called a glyph. In step 810 the information about each of the shots in the set of shots, and the dosage map 808 of this additional glyph is stored a library of glyphs 812. In one embodiment, a set of glyphs may be combined into a type of glyph called a parameterized glyph.

The required portion of the flow 800 involves creation of a pattern on a resist-covered substrate. In step 820 a combined dosage map for the substrate or a portion of the substrate is calculated. Step 820 uses as input the desired pattern 816 to be formed on the substrate, the process information 836, the stencil information 818, and the glyph library 812 if a glyph library has been created. In step 820 an initial substrate dosage map may be created, into which the shot dosage maps will be combined. Initially, the substrate dosage map contains no shot dosage map information. In one embodiment, the grid squares of the substrate dosage map may be initialized with an estimated correction for long-range effects such as backscattering, fogging, or loading. Step 820 may involve VSB/CP shot selection 822, or glyph selection 834, or both of these. Shot selection 822 may comprise selecting a series of curvilinear CP shots which can form a track on the substrate. If a VSB or CP shot is selected, the shot is simulated using charged particle beam simulation in step 824 and a dosage map 826 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. Both VSB and CP shots may be allowed to overlap, and may have varying dosages with respect to each other. If a glyph is selected, the dosage map of the glyph is input from the glyph library. In step 820, the various dosage maps of the shots and/or glyphs are combined into the substrate dosage map. In one embodiment, the combination is done by adding the dosages. Using the resulting combined dosage map and the process information 836 containing resist characteristics, a substrate pattern may be calculated. If the calculated substrate pattern matches the desired pattern 816 within a pre-determined tolerance, then a combined shot list 838 is output, containing the determined VSB/CP shots and the shots constituting the selected glyphs. If the calculated substrate pattern does not match the target pattern 816 within a predetermined tolerance as calculated in step 820, the set of selected CP shots, VSB shots and/or glyphs is revised, the dosage maps are recalculated, and the substrate pattern is recalculated. In one embodiment, the initial set of shots and/or glyphs may be determined in a correct-by-construction method, so that no shot or glyph modifications are required. In another embodiment, step 820 includes an optimization technique so as to minimize either the total number of shots represented by the selected VSB/CP shots and glyphs, or the total charged particle beam writing time, or some other parameter. In yet another embodiment, VSB/CP shot selection 822 and glyph selection 834 are performed so as to generate multiple sets of shots, each of which can form a reticle image that matches the desired pattern 816, but at a lower-than-normal dosage, to support multi-pass writing.

The combined shot list 838 comprises the determined list of selected VSB shots, selected CP shots and shots constituting the selected glyphs. All the shots in the final shot list 838 include dosage information. Shots may also include a beam blur specification. In step 840, proximity effect correction (PEC) and/or other corrections may be performed or corrections may be refined from earlier estimates. Thus, step 840 uses the combined shot list 838 as input and produces a final shot list 842 in which the shot dosages have been adjusted. The group of steps from step 820 through step 842, or subsets of this group of steps, are collectively called fracturing or mask data preparation. The final shot list 842 is used by the charged particle beam system in step 844 to expose resist with which the substrate has been coated, thereby forming a pattern 846 on the substrate.

The fracturing, mask data preparation, and proximity effect correction flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the optimization and simulation processes described in this disclosure may include iterative processes of revising and recalculating possible solutions, so as to minimize either the total number of shots, or the total charged particle beam writing time, or some other parameter. In another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, manufacturing a surface, and manufacturing an integrated circuit may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation for charged particle beam lithography comprising the steps of:
    inputting a set of character projection (CP) characters on a stencil, the set comprising one or more curvilinear characters; and
    determining a series of four or more shots of one or more curvilinear CP characters in the set of CP characters, wherein the series of shots is capable of forming a continuous track on a surface.

2. The method of claim 1 wherein the series of shots comprises shots of a plurality of curvilinear CP characters in the set of CP characters.

3. The method of claim 1 wherein the series of shots comprises shots of a circular or nearly-circular CP character.

4. The method of claim 3 wherein the series of shots comprises shots of a plurality of circular or nearly-circular CP characters of different diameters.

5. The method of claim 1 wherein the step of determining uses an optimization technique.

6. The method of claim 5 wherein the optimization technique reduces the dosage per unit area on the surface.

7. The method of claim 5 wherein the optimization technique reduces the total writing time for the series of shots.

8. The method of claim 1 wherein each shot in the series of shots comprises a dosage, and wherein the dosages of the shots in the series of shots vary with respect to each other before proximity effect correction.

9. The method of claim 1 wherein the step of determining comprises using charged particle beam simulation.

10. The method of claim 9 wherein the charged particle beam simulation includes at least one of the group consisting of forward scattering, backward scattering, resist diffusion, Coulomb effect, etching, fogging, loading and resist charging.

11. A method for fracturing or mask data preparation or proximity effect correction for character projection (CP) charged particle beam lithography comprising the steps of:
    inputting a pattern to be formed on a surface, wherein the pattern comprises a continuous track;
    inputting a set of character projection (CP) characters, the set comprising one or more curvilinear characters; and
    determining a series of two or more shots of one or more curvilinear CP characters in the set of CP characters, wherein the series of shots is capable of forming the track on the surface, within a pre-determined tolerance.

12. The method of claim 11 wherein the tolerance comprises a track width tolerance.

13. The method of claim 11 wherein the tolerance comprises a track waviness tolerance.

14. The method of claim 11 wherein the input pattern varies in width.

15. The method of claim 11 wherein the number of shots in the series of shots is reduced when compared to use of non-overlapping variable-shaped beam (VSB) shots to form the pattern.

16. The method of claim 11 wherein the input pattern is a constant width linear track which is not parallel to either axis of a Cartesian coordinate plane.

17. The method of claim 16 wherein the one or more curvilinear CP characters used by the shots in the series of shots are oval, nearly oval, elliptical, nearly elliptical, annular, nearly annular, oval-annular, nearly oval-annular, elliptically annular, or nearly elliptically annular.

18. The method of claim 17 wherein the waviness, shot count or total dosage for the series of shots is reduced when compared to use of circular CP characters for all shots in the series of shots.

19. A system for fracturing or mask data preparation for use with shaped beam charged particle beam lithography comprising:
    an input device capable of receiving a set of one or more curvilinear character projection (CP) characters; and
    a computation device capable of determining a series of two or more shots of one or more characters in the set of curvilinear CP characters, wherein the series of shots is capable of forming a continuous track on a surface.

20. The system of claim 19 wherein the series of shots comprises shots of a circular or nearly-circular CP character.

21. The system of claim 19 wherein the series of shots comprises shots of a plurality of curvilinear CP characters.

22. The system of claim 19 wherein the computation device uses an optimization technique.

23. The system of claim 19 wherein each shot in the series of shots comprises a dosage, and wherein the dosages of the shots in the series of shots vary with respect to each other before proximity effect correction.

24. The system of claim 19 wherein the computation device comprises a device capable of performing charged particle beam simulation.

25. The system of claim 24 wherein the charged particle beam simulation includes at least one of the group consisting of forward scattering, backward scattering, resist diffusion, Coulomb effect, etching, fogging, loading and resist charging.

* * * * *